(12) United States Patent
Mimura et al.

(10) Patent No.: US 10,290,707 B2
(45) Date of Patent: May 14, 2019

(54) SEMICONDUCTOR DEVICE

(71) Applicant: TOYOTA JIDOSHA KABUSHIKI KAISHA, Toyota-shi, Aichi-ken (JP)

(72) Inventors: Tomohiro Mimura, Kariya (JP); Takashi Kanemura, Kariya (JP); Masahiro Sugimoto, Toyota (JP); Narumasa Soejima, Nagakute (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/560,662

(22) PCT Filed: Mar. 10, 2016

(86) PCT No.: PCT/JP2016/001322
§ 371 (c)(1),
(2) Date: Sep. 22, 2017

(87) PCT Pub. No.: WO2016/152059
PCT Pub. Date: Sep. 29, 2016

(65) Prior Publication Data
US 2018/0097061 A1    Apr. 5, 2018

(30) Foreign Application Priority Data
Mar. 24, 2015    (JP) .................. 2015-061394

(51) Int. Cl.
*H01L 29/78*    (2006.01)
*H01L 29/10*    (2006.01)
(Continued)

(52) U.S. Cl.
CPC ............ *H01L 29/105* (2013.01); *H01L 29/06* (2013.01); *H01L 29/0623* (2013.01);
(Continued)

(58) Field of Classification Search
None
See application file for complete search history.

(56) References Cited

U.S. PATENT DOCUMENTS

| 2002/0106536 A1 | 8/2002 | Lee et al. |
| 2003/0030104 A1 | 2/2003 | Darwish et al. |

(Continued)

FOREIGN PATENT DOCUMENTS

| JP | 2002-319583 A | 10/2002 |
| JP | 2004-039813 A | 2/2004 |

(Continued)

OTHER PUBLICATIONS

Japan Patent Office, International Search Report and Written Opinion issued in the PCT application No. PCT/JP2016/001322, dated Jun. 7, 2016, 9 pages.

(Continued)

*Primary Examiner* — Michael Lebentritt
(74) *Attorney, Agent, or Firm* — Hunton Andrews Kurth LLP

(57)    ABSTRACT

A semiconductor device includes: a drain region; a drift layer made of a first conductivity type semiconductor with lower impurity concentration than the drain region; a base region made of a second conductivity type semiconductor; a source region made of the first conductivity type semiconductor with higher concentration; a contact region made of the second conductivity type semiconductor with higher concentration; a trench structure having a first gate insulation film and a first gate electrode arranged at an opening side of the trench and to be deeper than the base region, and a bottom part insulation film; a source electrode electrically connected to the source and contact regions; and a drain electrode at a rear side of the drain region. The drain is arranged to be deeper than the base region. The first gate (Continued)

insulation film is made of higher dielectric insulation material than the bottom part insulation film.

10 Claims, 3 Drawing Sheets

(51) Int. Cl.
    *H01L 29/06*     (2006.01)
    *H01L 29/12*     (2006.01)
    *H01L 29/08*     (2006.01)
    *H01L 29/16*     (2006.01)
    *H01L 29/66*     (2006.01)
    *H01L 29/40*     (2006.01)
    *H01L 29/423*     (2006.01)
    *H01L 29/51*     (2006.01)
    *H01L 29/739*     (2006.01)

(52) U.S. Cl.
    CPC ...... *H01L 29/0856* (2013.01); *H01L 29/1095* (2013.01); *H01L 29/12* (2013.01); *H01L 29/1608* (2013.01); *H01L 29/407* (2013.01); *H01L 29/42368* (2013.01); *H01L 29/517* (2013.01); *H01L 29/518* (2013.01); *H01L 29/66068* (2013.01); *H01L 29/66734* (2013.01); *H01L 29/78* (2013.01); *H01L 29/7813* (2013.01); *H01L 29/7397* (2013.01)

(56) References Cited

U.S. PATENT DOCUMENTS

| | | | |
|---|---|---|---|
| 2005/0074982 A1 | 4/2005 | Lee et al. | |
| 2011/0186927 A1 | 8/2011 | Kawaguchi et al. | |
| 2011/0284954 A1* | 11/2011 | Hsieh | H01L 29/0878 257/331 |
| 2011/0312138 A1 | 12/2011 | Yedinak et al. | |
| 2012/0228637 A1* | 9/2012 | Nakabayashi | H01L 21/046 257/77 |
| 2012/0241855 A1 | 9/2012 | Nakazawa et al. | |
| 2012/0241856 A1 | 9/2012 | Nakazawa et al. | |
| 2014/0209999 A1* | 7/2014 | Sato | H01L 29/7813 257/330 |
| 2014/0252465 A1 | 9/2014 | Takaya et al. | |
| 2015/0115286 A1* | 4/2015 | Takeuchi | H01L 21/8213 257/77 |
| 2017/0040420 A1* | 2/2017 | Mori | H01L 29/739 |
| 2017/0271323 A1* | 9/2017 | Sugawara | H01L 27/0296 |
| 2017/0330932 A1* | 11/2017 | Sugai | H01L 29/1095 |
| 2018/0114845 A1* | 4/2018 | Mimura | H01L 29/4236 |
| 2018/0138271 A1* | 5/2018 | Ohse | H01L 29/1095 |
| 2018/0151366 A1* | 5/2018 | Endo | H01L 21/2003 |

FOREIGN PATENT DOCUMENTS

| | | |
|---|---|---|
| JP | 2006-324570 A | 11/2006 |
| JP | 2008-227514 A | 9/2008 |
| JP | 2009/152630 A | 7/2009 |
| JP | 2010-129973 A | 6/2010 |
| JP | 2011-108701 A | 6/2011 |
| JP | 2011-159763 A | 8/2011 |
| JP | 2013-089778 A | 5/2013 |

OTHER PUBLICATIONS

Japan Patent Office, English translation of the Written Opinion/ISA issued in the PCT application No. PCT/JP2016/001322, dated Oct. 5, 2017, 6 pages.

\* cited by examiner

SEMICONDUCTOR DEVICE

CROSS REFERENCE TO RELATED APPLICATION APPLICATIONS

This is a national phase application based on the PCT International Patent Application No. PCT/JP2016/001322 filed on Mar. 10, 2016, claiming priority to Japanese Patent Application No. 2015-61394 filed on Mar. 24, 2015, the disclosure of both of which is incorporated herein by reference.

TECHNICAL FIELD

The present disclosure relates to a semiconductor device including a trench gate structure; in particular, is preferably to be applied to a semiconductor made of silicon carbide (hereinafter referred to as SiC).

BACKGROUND ART

It has been known that a semiconductor device has a vertical type MOSFET with a trench gate structure as a structure in which a channel density is made larger for making a larger current flow through a channel. In this trench gate structure, there is a structure in which an insulation film at the lower side of a gate insulation film inside the channel where a gate electrode is arranged, in other words, an insulation film is made to be thicker at the bottom part of the trench (hereinafter referred to as a bottom part insulation film). (For example, see Patent Literature 1). With this kind of structure, it is possible to decrease a parasitic capacitance Cgd through a shield effect due to having the bottom part insulation film, and also is possible to achieve high-speed switching as compared to a MOSFET without the bottom part insulation film.

The trench gate structure in the vertical type MOSFET having the above-mentioned bottom part insulation film is formed as described in the following. Firstly, subsequent to the formation of a p-type base region on an n-type drift layer, an n+ type source region is further formed by, for example, ion injection into the surface layer part of the p-type base region. Subsequently, a channel is formed from the n+ type source region and penetrates through the p-type base region and reaches the n-type drift layer. Then, the insulation material, which has the same properties as the gate insulation film, is deposited in order to configure the bottom part insulation film so as to bury the channel. Then, the insulation material for burying the channel is etched back to configure the bottom part insulation film. After that, subsequent to the formation of the gate insulation film on the surfaces of the trench and the bottom part insulation film, the gate electrode is arranged on the gate insulation film. Thus, the trench gate structure with a vertical type MOSFET having the bottom part insulation film is formed.

When the bottom part insulation film is formed by this kind of method, the etch-back controllability of the insulation material largely affects the performance of the MOSFET.

In particular, as illustrated in FIG. 5A and FIG. 5B, in a structure where an n-type drift layer J1, a p-type base region J2 and an n+ type source region J3 are arranged, a trench J4 is formed so as to penetrate the p-type base region J2 from the n+ source region J3 and reach the n type drift layer J1. Then a bottom part insulation film J5 is formed so as to leave a space at the bottom part of the trench J4.

In this situation, when the etch-back amount is lower, for example, the upper surface of the bottom part insulation film J5 is located at a position of the trench J4 which is shallower than the bottom part of the p-type base region J2, as illustrated in FIG. 5A. Accordingly, when a gate insulation film J6 and a gate electrode J7 are formed on the bottom part insulation film J5, the gate electrode J7 is not opposite to an entire region of the p-type base region J2 in a thickness direction. Accordingly, a channel region cannot be formed at the entire region of the p-type base region J2 located at the side surface of the trench J4, and hence the vertical type MOSFET with better properties cannot be attained.

On the other hands, when the etch-back amount is larger, for example, the bottom part insulation film J5 becomes slimmer as illustrated in FIG. 5B, and the electric field concentration occurs inside the gate insulation film J6 formed on the bottom part insulation film J5, and the insulation breakdown on the gate insulation film J6 might occur. Accordingly, the long-term reliability of the vertical MOSFET becomes lower.

Thus, with regard to the vertical type MOSFET with the trench gate structure having the bottom part insulation film, there are some difficulties in requesting the etch-back controllability at the formation of the bottom part insulation film and having a narrower process window.

PRIOR ART LITERATURES

Patent Literature

Patent Literature 1: JP 2009-152630 A

SUMMARY OF INVENTION

It is an object of the present disclosure to provide a semiconductor device that certainly forms a channel region while maintaining an insulation withstand voltage and achieving a wider process window.

A semiconductor device according to an aspect of the present disclosure includes: a drain region that is made of a first conductivity type semiconductor or a second conductivity type semiconductor; a drift layer that is arranged on the drain region, and is made of the first conductivity type semiconductor, which has an impurity concentration lower than the drain region; a base region that is arranged on the drift layer, and is made of the second conductivity type semiconductor; a source region that is arranged on an upper part of the base region, and is made of the first conductivity type semiconductor, which has a concentration higher than the drift layer; a contact region that is arranged on the upper part of the base region, and is made of the second conductivity type semiconductor, which has a concentration higher than the base layer; a trench gate structure that includes a first gate insulation film arranged inside a trench at an opening side, and arranged to be from an opening of the trench to a position deeper than the base region, a first gate electrode arranged on the first gate insulation film, a bottom part insulation film arranged inside the trench at a bottom part, which is below the first gate insulation film; a source electrode that is electrically connected to the source region and the contact region; and a drain electrode that is arranged at a rear side of the drain region. Additionally, the drain is arranged to be deeper than the base region from the surface of the source region. Moreover, the first gate insulation film is made of an insulation material having a dielectric constant higher than the bottom part insulation film.

Thus, the first gate insulation film is made of the insulation material with a higher dielectric constant than the dielectric constant of the bottom part insulation film. Accordingly, the electric field concentration inside the first gate insulation film can be relaxed and the insulation breakdown of the first gate insulation film can be inhibited. Since the insulation breakdown of the first gate insulation film can be inhibited, the bottom part insulation film may be made to be slimmer a little. Therefore, in the manufacturing process for the trench gate structure, when the insulation material for configuring the bottom part insulation film to bury the channel is etched back, it can be designed to allow the excess amount of etch-back.

In this situation, even if it is possible to make the bottom part insulation film be slimmer a little, as described above, it is possible to inhibit the insulation breakdown of the first gate insulation film even if the bottom part insulation film is made to be slimmer a little. Therefore, the bottom part of the first gate electrode is formed until the position, which is deeper than the bottom part of the base region, and the channel region can be formed at the entire region of the base region at the side surface of the trench.

Accordingly, it is possible to provide a semiconductor device that certainly forms a channel region while maintaining an insulation withstand voltage and achieving a wider process window.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
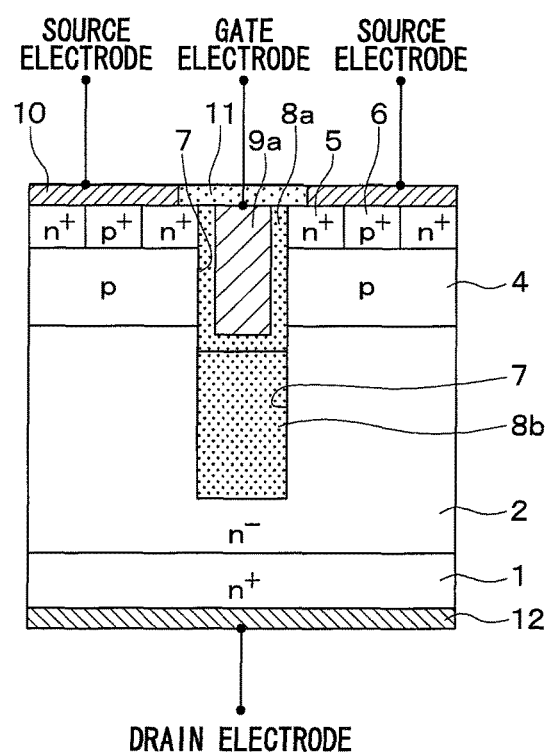
FIG. 1 is a drawing that illustrates a cross sectional configuration of a SiC semiconductor device according to a first embodiment of the present disclosure.

The following describes embodiments of the present disclosure based on the drawings. Note that in the following embodiments, portions identical or equivalent to each other, a description will be given the same reference numerals.

First Embodiment

The following describes a first embodiment of the present disclosure. Herein, a SiC semiconductor device formed by SiC is used as an example of semiconductors; however, a semiconductor formed by, for example, Si may also be used for configuring a semiconductor.

Firstly, the SiC semiconductor device having a vertical type MOSFET with an inversion type trench gate structure is described with reference to FIG. 1. It is noted that only one-cell portion of the vertical type MOSFET is illustrated in FIG. 1, the structure similar to the vertical type MOSFET illustrated in FIG. 1 can also be provided with a plurality of cells, which are adjacent to each other. The one-cell refers to the center of the after-mentioned p+ type contact region 6 to the center of the adjacent p+ type contact region 6, and the trench gate structure is arranged between the both of p+ type contact regions 6.

As illustrated in FIG. 1, the SiC semiconductor device is formed by using an n+ type semiconductor substrate 1 comprising a SiC single crystal with a thickness of 300 µm, and the semiconductor substrate 1 is doped with n-type impurities (such as phosphor or nitrogen) with high concentration of impurities about $1\times10^{19}$ to $1\times10^{20}$ cm$^{-3}$. On the n+ type semiconductor substrate 1, an n-type drift layer 2 comprising SiC with a thickness of about 5 µm to 15 µm is formed, In addition, the n-type drift layer 2 is doped by n-type impurities with impurity concentration about $1\times10^{15}$ to $1\times10^{16}$ cm$^{-3}$.

Additionally, on the surface of the n-type drift layer 2, a p-type base region 4 comprising SiC is formed. The p-type base region 4 is a layer in which a channel region of the vertical type MOSFET is configured. At both sides of a trench 7 configuring the after-mentioned trench gate structure, the p-type base region is formed so as to have a contact with the side surface of the trench 7. The p-type base region 4 is doped by p-type impurities with an impurity concentration of, for example, between $1\times10^{15}$ and $1\times10^{18}$ cm$^{-3}$, and have a thickness of, for example, about 0.7 µm to 1.8 µm.

At the side of the trench 7 at the surface layer portion of the p-type base region 4, an n+ type source region 5, which is doped by n-type impurities with a higher concentration, is formed so as to have a contact with the trench gate structure. In the present embodiment, for example, the n+ type source region 5 is formed with, for example, ion injection into the p-type base region 4, and is formed with an impurity concentration of about $1\times10^{21}$ cm$^{-3}$ and with a thickness of about 0.3 µm. In addition, the p+ type contact region 6 doped with a higher concentration of p-type impurities is formed at a position opposite to the trench 7, which holds the n+ type source region 5 at the surface layer part of the p-type base region 4. In this present embodiment, for example, the p+ type contact region 6 is formed by, for example, ion injection into the p-type base region 4, and is formed so as to have the impurity concentration of about $1\times10^{21}$ cm$^{-3}$ and with a thickness of about 0.3 µm.

Moreover, the trench 7 is formed such that the trench 7 penetrates the p-type base region 4 and the n+ type source region 5 and reaches the drift layer 2; and the bottom part of the trench 7 is set as the depth, which is away from the surface of the n+ type semiconductor substrate 1 with a predetermined distance. Accordingly, the p-type base region 4 and the n+ type source region 5 are arranged to have a contact with the side surface of the trench 7.

Subsequently, the trench gate structure is configured inside the trench 7. In particular, a first gate electrode 9a is formed through the first gate insulation 8a at the opening side of the trench 7 inside the trench 7, and a bottom part insulation film 8b is formed below the first gate electrode 9a, in other words, is formed at the bottom part of the trench 7. Additionally, the first gate insulation film 8a is formed so as to cover the side surface of the trench 7 and the upper surface of the bottom part insulation film 8b. By arranging the first gate electrode 9a on the surface of the first gate insulation film 8a, the trench 7 can be buried. Thus, with the structure having the first gate insulation film 8a, the first gate electrode 9a and the bottom part insulation film 8b inside the trench 7, the trench gate structure is configured.

The first gate insulation film 8a is made of the insulation material having a dielectric constant higher than the bottom part insulation film 8b. For example, the first gate insulation film 8a may be formed by one of silicon nitride oxide, silicon nitride, aluminum oxide, aluminum nitride, hafnium oxide, hafnium nitride, titanium oxide, zirconium oxide, and rare earth oxide (for example, lanthanum oxide, cerium oxide, and yttrium oxide), or by the mixture of two or more of the above chemical compounds, or by the lamination layers of two or more of the above chemical compounds; and the film thickness of the first gate insulation film 8a may be set, for example, about between 50 nm and 200 nm. The first gate electrode 9a is formed from the surface of the trench 7 to a position deeper than the bottom part of the p-type base region 4. The first gate electrode 9a is made of Poly-Si doped by impurities, and may be applied by a gate voltage by connecting the first gate electrode 9a to a gate wiring (not shown). Accordingly, when the gate voltage is applied, a channel may be formed at the side surface of the trench 7 at the p-type base region 4, in other words, the entire region of a portion which is opposite to the first gate electrode 9a. With regard to the depth of the part, which includes the whole first gate insulation film 8a and the whole first gate electrode 9a, it is preferable that the bottom part of the first gate electrode 9a is at the position, which is deeper than the bottom part of the p-type base region 4. For example, the depth is set between 0.8 μm and 2 μm.

The bottom part insulation film 8b included at the bottom part of the trench 7 is made of the material having a dielectric constant lower than the first gate insulation film 8a. For example, the bottom part insulation film 8b is made of, for example, a silicon oxide film ($SiO_2$). With regard to the thickness of the bottom part insulation film 8b, it can be set arbitrarily as long as the bottom part insulation film 8b is formed within the thickness of the n-type drift layer 2. In the present embodiment, the bottom part insulation film 8b is set to have a thickness of, for example, about between 0.8 μm and 2 μm.

Although it is not illustrated in FIG. 1, the trench gate structure is configured, for example, in a strip form in a paper vertical direction as a longitudinal direction; and the plurality of trench gate structures are configured to include a plurality of cells by arranging the plurality of trench gate structures into a stripe shape with an equal interval in a paper horizontal direction.

At the surface of the n+ type source region 5 and the p+ contact region 6, a source electrode 10 is formed. The source electrode 10 is made of a plurality of metals (for example, Ni/Al). Specifically, the part of the source electrode 10 connected to the n+ source region 5 is made of the metal, which can have an ohmic contact with n-type SiC; and the part of the source electrode 10 connected to the p-type base region 4 through the p+ contact region 6 is made of the metal, which can have an ohmic contact with p-type SiC. The source electrode 10 is electrically isolated from the gate wiring (not shown), which is electrically connected to the first gate electrode 9a. The source electrode 10 then has an electrical contact with the n+ type source region 5 and the p+ type contact region 6 through a contact hole formed at an interlayer insulation film 11.

A drain electrode 12 electrically connected to the n+ type semiconductor substrate 1 is formed at the rear side of the n+ type semiconductor substrate 1. According to this kind of configuration, the vertical type MOSFET having an inversion type channel gate structure with n-channel type is configured.

With regard to the vertical type MOSFET as described above, when a gate voltage is applied to the first gate electrode 9a, the part of the p-type base region 4 having a contact with the side surface of the trench 7 becomes an inversion type channel and then a current flows between the source electrode 10 and the drain electrode 12.

On the other hands, a higher voltage (for example, 1200V) is applied as the drain voltage in a situation where a gate voltage is not applied. In the SiC having electric field breakdown strength, which is nearly 10 times larger than a silicon device, with an influence of the higher voltage, the electric field having 10 times larger than the silicon device is applied to the trench gate structure, and then the electric field concentration occurs.

However, in the present embodiment, since the first gate insulation film 8a is made of the insulation material having a higher dielectric constant, the electrical field concentration can be relaxed at the off-time. In other words, when the first gate insulation film 8a is made of the insulation film with a higher dielectric constant, the influx of a high voltage into the first gate insulation film 8a can be inhibited as compared to the situation where the first gate insulation film 8a is made of the insulation material with a lower dielectric constant. Accordingly, the influx of an electrical field into the first gate insulation film 8a at the upper side is inhibited, the interval between equipotential lines inside the first gate insulation film 8a becomes wider, and the electrical field concentration inside the first gate insulation film 8a, in particular, at the position of the corner part of the trench 7 can be relaxed. Accordingly, it is possible to inhibit insulation breakdown of the first gate insulation film 8a for aiming insulation between the first gate electrode 9a and the drain.

Thus, the first gate insulation film 8a is made of the insulation material having a dielectric constant higher than the bottom part insulation film 8b. Accordingly, the electrical field can be relaxed inside the first gate insulation film 8a, and the insulation breakdown of the first gate insulation film 8a can be inhibited. Since the insulation breakdown of the first gate insulation film 8a can be inhibited, the bottom part insulation film 8b may be made to be slimmer a little. Thus, in the manufacturing process for making the trench gate structure, when the insulation material for configuring the bottom part insulation film 8b buried inside the trench 7 is etched back, it can be designed to have the excess amount of etch-back.

In particular, the manufacturing process for the trench gate structure is carried out as described in the following. Firstly, the trench 7 is formed so as to penetrate through the p-type base region 4 and the n+ source region 5 and reach the n-type drift layer 2, and then the trench 7 is buried by the insulation material for configuring the bottom part insulation film 8b. The trench 7 is buried by the insulation material for configuring the bottom part insulation film 8b through, for example, CVD (chemical vapor deposition) or ALD (atomic layer deposition). Subsequently, the first gate insulation film 8a is formed on the surface of the trench 7 and the bottom part insulation film 8b through, for example, CVD or ALD, and then the first gate electrode 9a is arranged on the first gate insulation film 8a. Thus, the trench gate structure including the vertical type MOSFET having the bottom part insulation film is formed.

In the trench gate structure is formed through the manufacturing process, when the insulation material, which configures the bottom part insulation film 8b buried at the trench 7, is etched back, etch-back is performed in a larger amount so that the upper surface of the bottom part insulation film 8b is certainly located at the location, which is deeper than the bottom part of the p-type base region 4. In this situation, it is possible that the bottom part insulation film 8b becomes slimmer a little. However, the first gate insulation film 8a is made of the insulation material having a higher dielectric constant even if the bottom part insulation film 8b is made to be slimmer a little. Accordingly, the insulation breakdown of the first gate insulation film 8a can be inhibited. Therefore, the bottom part of the first gate electrode 9a can be formed until the position, which is deeper than the bottom part of the p-type base region 4, and the channel region can be formed at the entire region of the p-type base region 4 at the side surface of the trench 7.

Accordingly, it is possible to provide a semiconductor device that certainly forms a channel region while maintaining an insulation withstand voltage and achieving a wider process window.

In addition, when the bottom part insulation film 8b is made of the same material, which configures the first gate insulation film 8a, as is conventionally done, the switching speed may get lower as the parasitic capacitance Cgd gets larger in a case where the bottom part insulation film 8b gets slimmer. However, in the present embodiment, since the bottom part insulation film 8b is made of the insulation material having a dielectric constant lower than the first gate insulation film, the parasitic capacitance Cgd can get lower even if the bottom part insulation film 8b is made to be slimmer. Accordingly, it is possible to inhibit lowering the switching speed.

Second Embodiment

A second embodiment of the present disclosure is described. The present embodiment describes a change in the trench gate structure as compared to the first embodiment. The other parts of the second embodiment are similar to the ones in the first embodiment; therefore, only the part different from the first embodiment is described.

Figure 2:
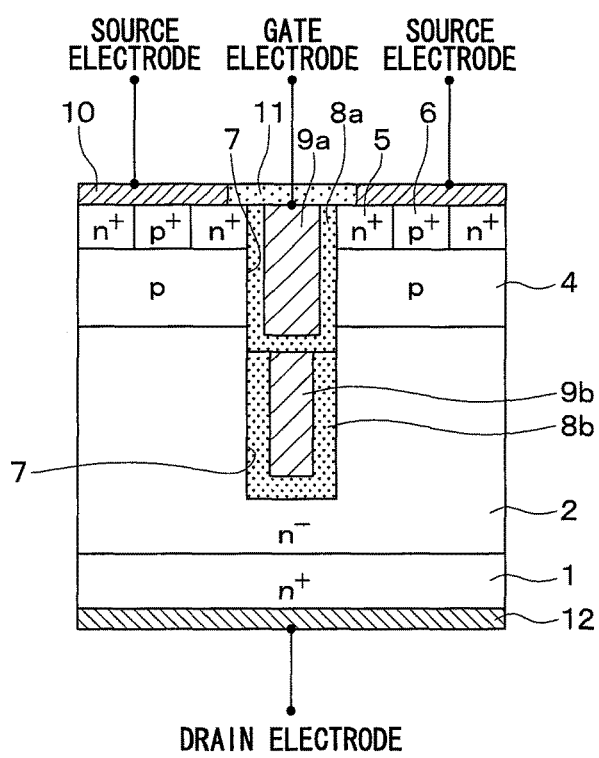
FIG. 2 is a drawing that illustrates a cross sectional configuration of a SiC semiconductor device according to a second embodiment of the present disclosure.

As illustrated in FIG. 2, the present embodiment is configured to have a double gate structure with an upper gate structure and a lower gate structure. Particularly, inside the trench 7, an upper gate structure including a first gate insulation film 8a and a first gate electrode 9a is arranged at the upper side of the trench 7 as the opening side of the trench 7; and a lower gate structure including a second gate insulation film 8b and a second gate electrode 9b is arranged at the lower side of the trench 7. In other words, the second gate insulation film is made of the bottom part insulation film 8b, and the second gate electrode 9b is arranged inside the bottom part insulation film 8b. The second gate electrode 9b is made of Poly-Si doped by impurities, and is connected to a source potential connected to a source electrode 10 at the other cross section, which is different from FIG. 2.

With the above configuration, the trench gate structure is made of the double gate structure including the upper gate structure and the lower gate structure inside the trench 7.

Even in a case where the trench gate structure is made of the double gate structure, as similar to the first embodiment, the first gate insulation film 8a can be made of the insulation material with a higher dielectric constant, and the bottom part insulation film 8b for configuring the second gate insulation film can be made of the insulation material with a lower dielectric constant. With this configuration, the similar effect generated in the first embodiment can be achieved. By configuring the second gate electrode 9b at the source potential, it is possible to further decrease the parasitic capacitance Cgd and achieve the electrical field concentration at the bottom part of the trench gate, and then further to improve switching speed and the insulation withstand voltage.

Third Embodiment

A third embodiment of the present disclosure is described. The present embodiment related to the structure that aims for further having a higher withstand voltage as compared to the first and second embodiments. Since the other parts of the present disclosure are similar to the ones in the first and second embodiments, only the parts different from the first and second embodiments are described. It is noted that the following describes a situation where the structure of the present embodiment is applied to the structure of the first embodiment; however, the same structure can also be applied to the second embodiment.

Figure 3:
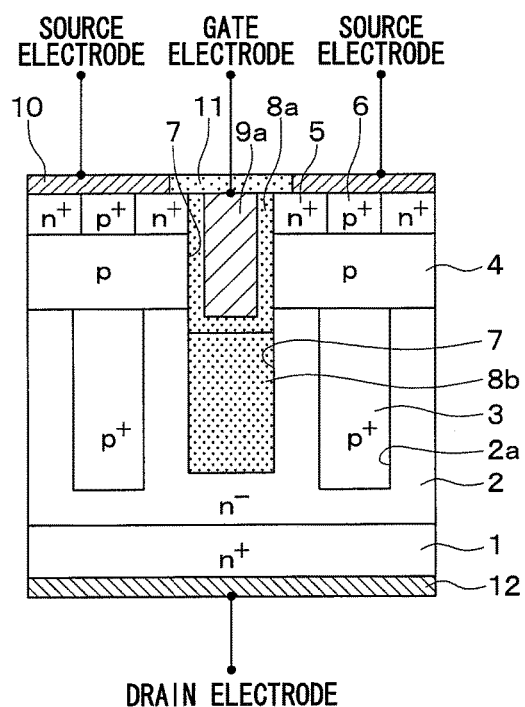
FIG. 3 is a drawing that illustrates a cross sectional configuration of a SiC semiconductor device according to a third embodiment of the present disclosure.

As shown in FIG. 3, in the SiC semiconductor device according to the present embodiment, at the both sides of the trench gate structure, a p-type deep layer 3 is formed so as to be away from the trench 7 with a predetermined distance. In this present embodiment, the p-type deep layer 3 is configured to be parallel to the trench 7, in other words, is configured into a strip form in a paper up-down direction of FIG. 3 as a longitudinal direction. The plurality of p-type deep layers 3 are arranged in a stripe form, and are made of the layout in which the trench 7 is arranged between each of the plurality of p-type deep layers 3. In particular, at the both sides of the position where the trench 7 is formed, a recess part (a first recess part) 2, which is partially hollow inside the recess part 2, and the p-type deep layer 3 is formed by burying the p-type layer, which is doped by p-type impurities, inside the recess part 2. The p-type deep layer 3 is configured such that the p-type impurity concentration is higher than the p-type base region 4, and is set to have a concentration of, for example, about between $1\times10^{17}$ and $1\times10^{19}$ cm$^{-3}$.

Thus, the SiC semiconductor device according to the present embodiment is configured to have the p-type deep layer 3. Accordingly, a depletion layer at a PN junction part between the p-type deep layer 3 and the n-type drift layer 2 is largely stretched to the n-type drift layer side 2, and the higher voltage due to the influence of the drain voltage gets harder to enter the bottom part insulation film 8b.

Accordingly, the higher voltage becomes harder to get into the first gate insulation film 8a, and the electric field concentration inside the first gate insulation film 8a, in particular, the electric field concentration at the bottom part of the trench 7 as a part of the first gate insulation film 8a can be relaxed. Accordingly, the SiC semiconductor device can withstand a higher voltage because the insulation breakdown of the first gate insulation film 8a can be inhibited.

Fourth Embodiment

A fourth embodiment of the present disclosure is described. The present embodiment related to the structure that aims for further having a higher withstand voltage as compared to the first and second embodiments. Since the other parts of the present disclosure are similar to the ones in the first and second embodiments, only the parts different from the first embodiment are described. It is noted that the following describes a situation where the structure of the present embodiment is applied to the structure of the first embodiment; however, the same structure can also be applied to the second embodiment.

Figure 4:
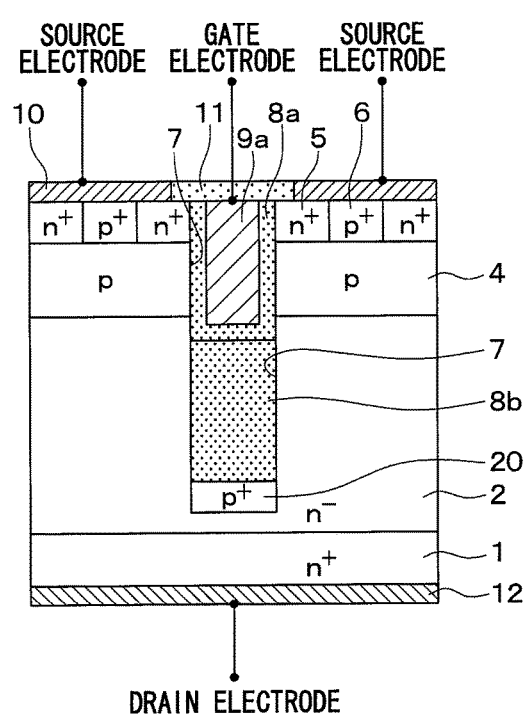
FIG. 4 is a drawing that illustrates a cross sectional configuration of a SiC semiconductor device according to a fourth embodiment of the present disclosure.
Figure 5A:
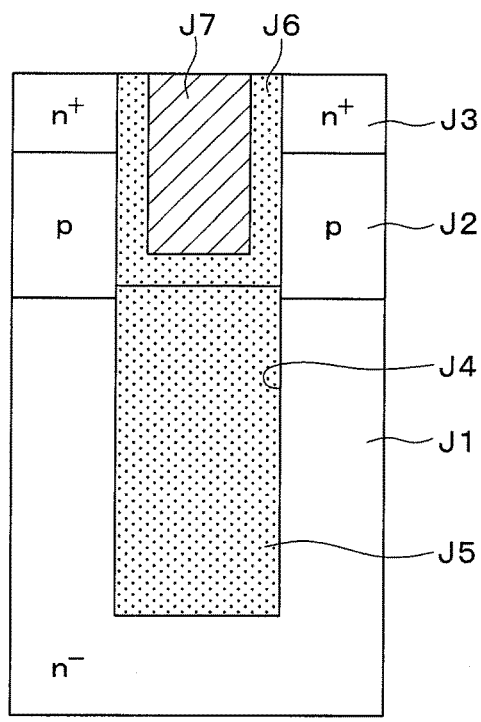
FIG. 5A is a drawing that illustrates a sectional view of a change in a trench gate structure with unevenness of etch-back in a situation where a bottom part insulation film is formed inside the trench.
Figure 5B:
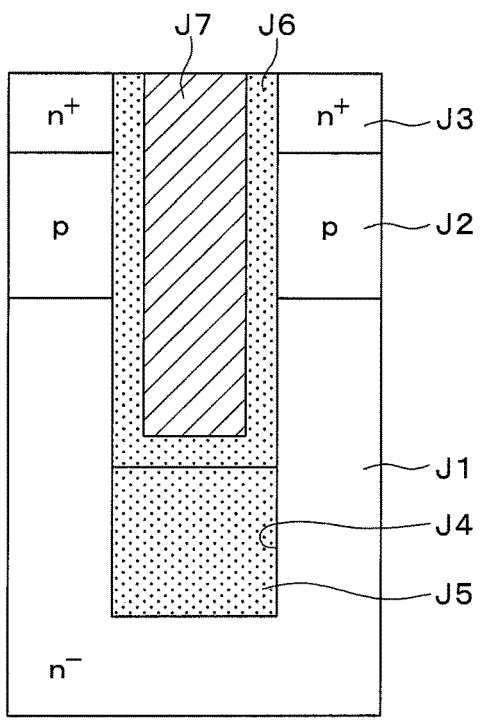
FIG. 5B is a drawing that illustrates a sectional view of a change in a trench gate structure with unevenness of etch-back in a situation where a bottom part insulation film is formed inside the trench.

As shown in FIG. 4, in the SiC semiconductor device according to the present embodiment, a p-type bottom layer 20 is formed at the surface layer part of the n-type drift layer 2 at the bottom of the trench gate structure. In the present embodiment, the p-type bottom layer 20 is formed at the entire region of the bottom part of the trench 7, in other words, formed into a strip form in a paper vertical direction of FIG. 4 as a longitudinal direction. For example, subsequent to the formation of the trench 7, the p-type bottom layer 20 is formed by ion injection of p-type impurities in a state where the parts other than the trench 7 are covered by a mask. The p-type bottom layer 20 is configured such that the p-type impurity concentration is higher than the p-type base region 4, and is set to have a concentration of, for example, about between $1 \times 10^{17}$ and $1 \times 10^{19}$ cm$^{-3}$.

Thus, the SiC semiconductor device according to the present embodiment is configured to have the p-type bottom layer 20. Accordingly, a depletion layer at a PN junction part between the p-type bottom layer 20 and the n-type drift layer 2 is largely stretched to the n-type drift layer side 2, and the higher voltage due to the influence of the drain voltage gets harder to enter the bottom part insulation film 8b.

Accordingly, the higher voltage becomes harder to get into the first gate insulation film 8a, and the electric field concentration inside the first gate insulation film 8a, in particular, the electric field concentration at the bottom part of the trench 7 as a part of the first gate insulation film 8a can be relaxed. Accordingly, the SiC semiconductor device can withstand a higher voltage because the insulation breakdown of the first gate insulation film 8a can be inhibited.

It is noted that, when the p-type bottom layer 20 formed at the bottom part of the trench 7 such as the one disclosed in the present embodiment is formed by ion injection, it is preferable that the side surface of the trench 7 is perpendicular to the substrate; or the bottom part of the trench 7 is made to have a larger width than the width of the opening of the trench 7 so as to make the side surface of the trench 7 formed into an inverse taper shape. When the side surface of the trench 7 is tilted, the ion injection can be performed on the side surface so that it is possible to vary the element characteristics of the vertical type MOSFET.

Other Embodiments

The present disclosure is not only limited to the above embodiments, but also possible to be modified within the technical scope described in the present disclosure.

For example, the layout of the p-type deep layer 3 described in the third embodiment is one example. However, it is not only restricted to the case where the p-type deep layer 3 is formed to be parallel to the trench 7. The p-type deep layer 3 may be formed so as to intersect with the trench 7, or also may be formed into a dot shape or a mesh shape. Additionally, the trench 7 may not be only formed into a stripe shape; however, the trench 7 may also formed into a dot shape or a mesh shape.

In addition, the structure may also include the p-type deep layer 3 described in the third embodiment and the p-type bottom layer 20 described in the fourth embodiment.

The above embodiments describe the SiC semiconductor device as an example; however, the semiconductor device may also be made of other semiconductor material such as Si. In the case of the SiC semiconductor device described in each of the embodiments, the n-type drift layer 2 is formed on the n+ type semiconductor substrate 1 for configuring the drain region. However, the n-type drift layer 2 may be made of n-type substrate so as to form the drain region configured at the n+ type layer by, for example, performing ion injection of n-type impurities at the rear side of the n-type substrate.

In the third embodiment, the p-type deep layer 3 is formed to be deeper than the trench 7, the p-type deep layer 3 may be formed to be deeper than at least the upper gate structure. In other words, since the first gate insulation film 8a is to be protected from insulation breakdown at the p-type deep layer 3, the relaxation of electric field concentration may be aimed inside the first gate insulation film 8a. Accordingly, the effect of electric field concentration inside the first gate insulation film 8a can be achieved by making at least the p-type deep layer 3 to be located deeper than the upper gate structure.

The above embodiments describe an example of the n-channel type MOSFET with n-type as a first conductivity type and p-type as a second conductivity type. However, the present disclosure may also be applied to a p-channel type MOSFET in which the conductivity of each configuration element is inverted. Additionally, the above description states an example of the MOSFET with a trench gate structure; however, the present disclosure may also be applied to an IGBT with the similar trench gate structure. In a case of using the IGBT, only the conductivity type of the substrate 1 is modified from n-type to p-type as compared to the above embodiments. With regard to the other structures and manufacturing methods, they are similar to the ones described in each embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a drain region that is made of a first conductivity type semiconductor or a second conductivity type semiconductor;
   a drift layer that is arranged on the drain region, and is made of the first conductivity type semiconductor, which has an impurity concentration lower than the drain region;
   a base region that is arranged on the drift layer, and is made of the second conductivity type semiconductor;
   a source region that is arranged on an upper part of the base region, and is made of the first conductivity type semiconductor, which has a concentration higher than the drift layer;
   a contact region that is arranged on the upper part of the base region, and is made of the second conductivity type semiconductor, which has a concentration higher than the base layer;
   a trench gate structure that includes
      a first gate insulation film arranged inside a trench at an opening side, and arranged to be from an opening of the trench to a position deeper than the base region,
      a first gate electrode arranged inside a trench at an opening side, and arranged to be from an opening of the trench to a position deeper than the base region, and arranged on the first gate insulation film, a bottom part insulation film arranged inside the trench at a bottom part, which is below the first gate insulation film;

a source electrode that is electrically connected to the source region and the contact region; and a drain electrode that is arranged at a rear side of the drain region, wherein:

the drain region is arranged to be deeper than the base region from the surface of the source region; and the first gate insulation film is made of an insulation material having a dielectric constant higher than the bottom part insulation film, wherein the bottom part insulation film extends from the first gate insulation film to a bottom of the trench.

2. The semiconductor device according to claim 1, wherein:

the first gate insulation film and the first gate electrode configure an upper gate structure arranged inside the trench at an upper side;

a lower gate structure is arranged inside the trench at a lower side, which is below the upper gate structure, and includes a second gate insulation film made of the bottom part insulation film and a second gate electrode arranged on the second gate insulation film; and a trench gate structure is made of a double gate structure, which includes the upper gate structure and the lower gate structure.

3. The semiconductor device according to claim 2, wherein the second gate electrode is connected to the source electrode and is set at a source potential.

4. The semiconductor device according to claim 1, the bottom part gate insulation film is made of a silicon oxide film; and the first gate insulation film is made of an insulation material having a dielectric constant higher than the silicon oxide film.

5. The semiconductor device according to claim 4, wherein the first gate insulation film is made of one of silicon nitride oxide, silicon nitride, aluminum oxide, aluminum nitride, hafnium oxide, hafnium nitride, titanium oxide, zirconium oxide, and rare earth oxide.

6. The semiconductor device according to claim 4, wherein the first gate insulation film is made of a mixture including two or more of silicon nitride oxide, silicon nitride, aluminum oxide, aluminum nitride, hafnium oxide, hafnium nitride, titanium oxide, zirconium oxide, and rare earth oxide.

7. The semiconductor device according to claim 4, wherein the first gate insulation film is made of a lamination layer including two or more of silicon nitride oxide, silicon nitride, aluminum oxide, aluminum nitride, hafnium oxide, hafnium nitride, titanium oxide, zirconium oxide, and rare earth oxide.

8. The semiconductor device according to claim 1, further comprising:

a second conductivity type deep layer that is arranged inside the drift layer located below the base region, and that is arranged to be deeper than the bottom part of the first gate insulation film, and that is configured to have a second conductivity type impurity concentration higher than the base region.

9. The semiconductor device according to claim 1, further comprising:

a second conductivity type bottom layer that is arranged inside the drift layer at the bottom part of the trench, and that is configured to have a second conductivity type impurity concentration higher than the base region.

10. The semiconductor device made of silicon carbide, according to claim 1, wherein a semiconductor for configuring the semiconductor device is made of silicon carbide.

* * * * *